United States Patent [19]

Kim

[11] Patent Number: 5,656,533
[45] Date of Patent: Aug. 12, 1997

[54] METHOD OF PREVENTING POLYSILICON STRINGERS DURING FORMATION OF A STACKED DOUBLE POLYSILICON STRUCTURE BY USING DIELECTRIC SIDEWALL SPACERS

[75] Inventor: Un Soon Kim, Santa Clara, Calif.

[73] Assignee: National Semiconductor Corporation, Santa Clara, Calif.

[21] Appl. No.: 587,400

[22] Filed: Jan. 17, 1996

[51] Int. Cl.[6] ................................................ H01L 21/70
[52] U.S. Cl. ................................................ 438/396; 438/704
[58] Field of Search ................................ 437/47, 49, 52, 437/60, 919, 228; 148/DIG. 14

[56] References Cited

U.S. PATENT DOCUMENTS 4,749,443   6/1988   Mitchell et al. ............................ 437/49

FOREIGN PATENT DOCUMENTS 5183127   7/1993   Japan .

OTHER PUBLICATIONS

J. Jasper, "Sloped etching of highly phosphorous doped polysilicon developed with response surface methodolog," SPIE vol. 1803 (1992) 1 page.

Primary Examiner—Tuan H. Nguyen
Attorney, Agent, or Firm—Limbach & Limbach L.L.P.

[57] ABSTRACT

A process for producing dual layer polysilicon structures without the formation of residual polysilicon stringers and the resulting structure. Dielectric sidewalls are formed upon a first polysilicon structure to prevent the formation of overhang regions during subsequent oxidation that will harbor residual polysilicon stringers formed by the deposition of a second polysilicon structure on top of the first polysilicon structure.

10 Claims, 7 Drawing Sheets

Poly 1 profile after Etch

FIG. 5a

Poly 1 profile after oxidation

FIG. 5b

Structure after Poly 2 Dep

FIG. 5c

No stringers after poly 2 etch

Spacer Forms during spacer etch

FIG. 12a

Structure after poly 2 Dep

METHOD OF PREVENTING POLYSILICON STRINGERS DURING FORMATION OF A STACKED DOUBLE POLYSILICON STRUCTURE BY USING DIELECTRIC SIDEWALL SPACERS

BACKGROUND OF THE INVENTION

The present invention relates to the manufacture of integrated circuits (ICs) and, more particularly, to the use of sidewall spacers in the formation of double polysilicon capacitors to prevent polysilicon stringers.

DESCRIPTION OF THE RELATED ART

One of the problems encountered during double polysilicon capacitor fabrication is the polysilicon "stringer". A stringer is the residual polysilicon from a second polysilicon layers that remains beneath an overhang in the structure of a first polysilicon layer when the second polysilicon layer is anisotropically etched. The stringers can provide undesirable conducting paths which may cause malfunctioning of the capacitor or transistor formed with a stringer present.

Figure 1:
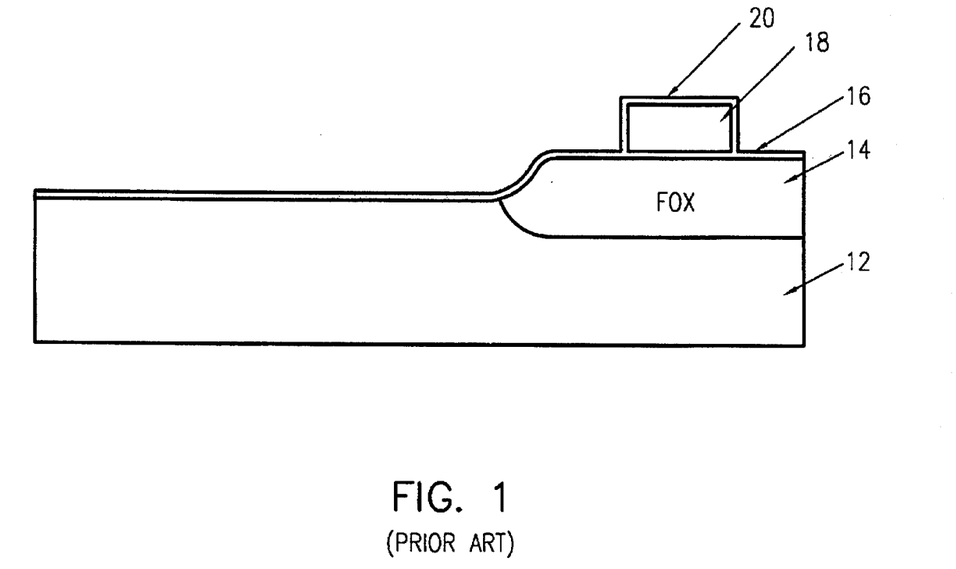
FIGS. 1, 2 and 3 are partial cross-section drawings illustrating the progression of steps in a prior art process.
Figure 4A:
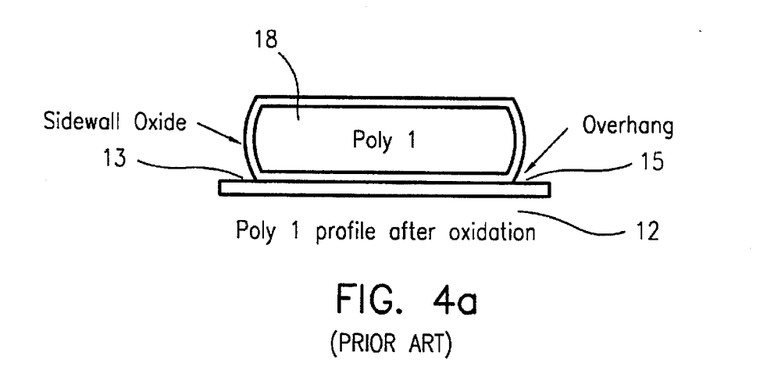
FIGS. 4a and 4b are partial cross-section drawings illustrating the overhang areas and polysilicon stringers that are formed as a result of a prior art process.

In fabricating a double polysilicon layer capacitor in the conventional manner, a field oxide region 14 is first formed on a silicon substrate 12, as shown in FIG. 1. Then, a first polysilicon layer is deposited and anisotropically etched to produce first polysilicon plate 18 that has a highly vertical sidewall profile and that will serve as the bottom electrode of the capacitor. Next, a gate oxidation step is performed that creates the gate oxide 16 necessary for the active regions to be formed on the substrate 12. Gate oxidation also causes oxide 20 to form on the exposed surfaces of polysilicon plate 18 that will become an interpolysilicon layer that is the dielectric layer of the capacitor. The oxidation step causes the sidewall profile of the first polysilicon plate 18 to become irregular, forming overhang regions 13 and 15, as shown in FIG. 4a.

Figure 2:
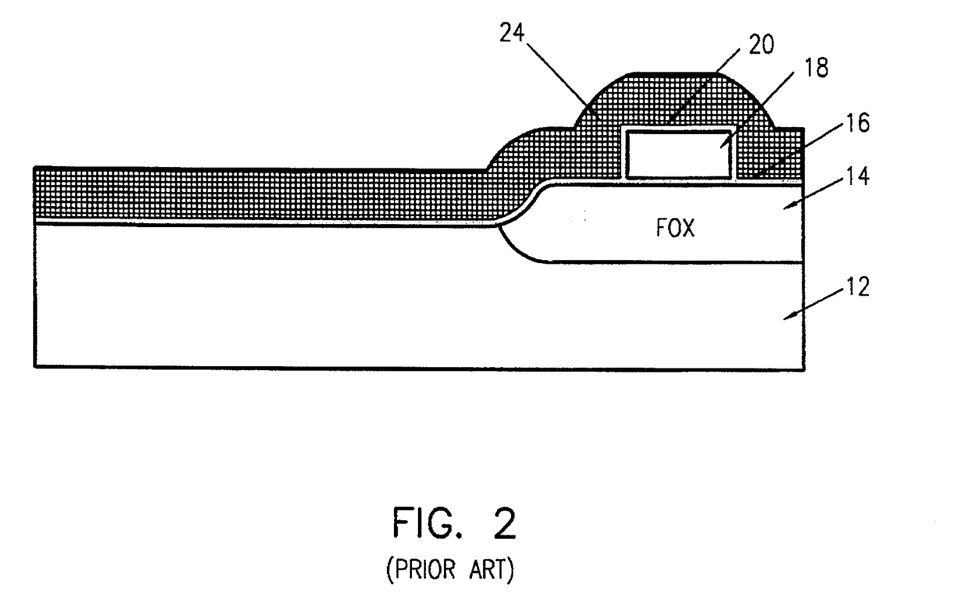
Figure 3:
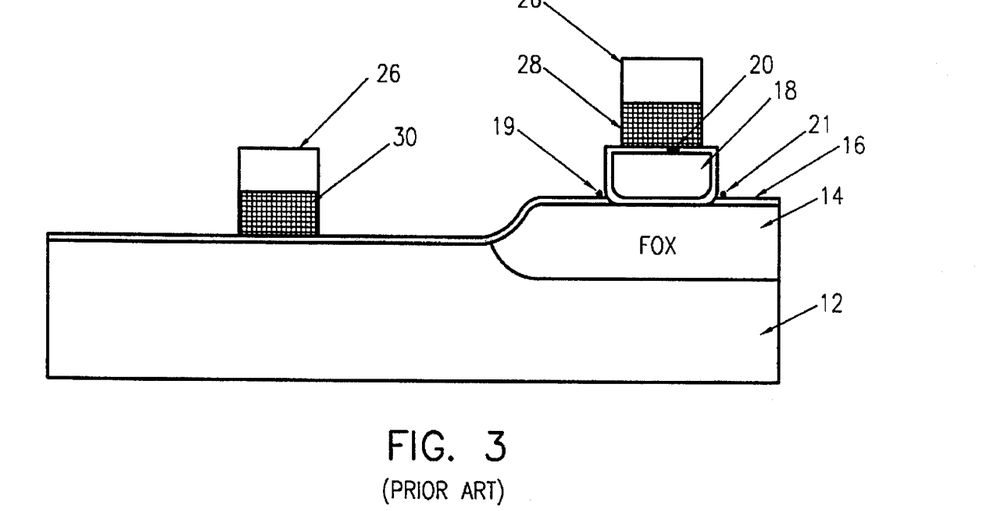
Figure 4B:
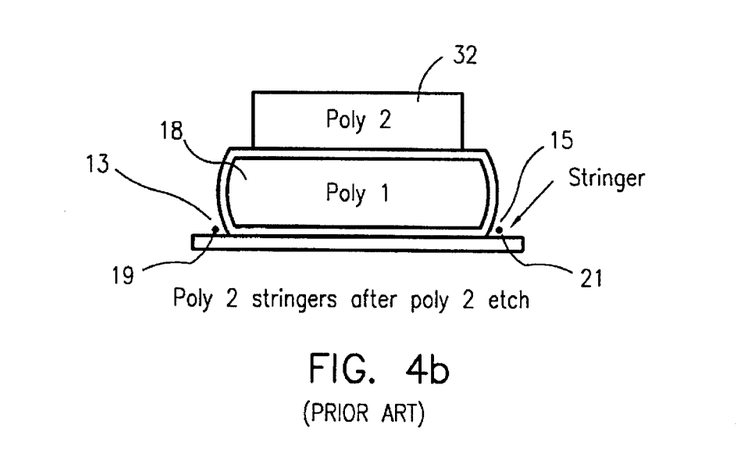
Figure 5A:
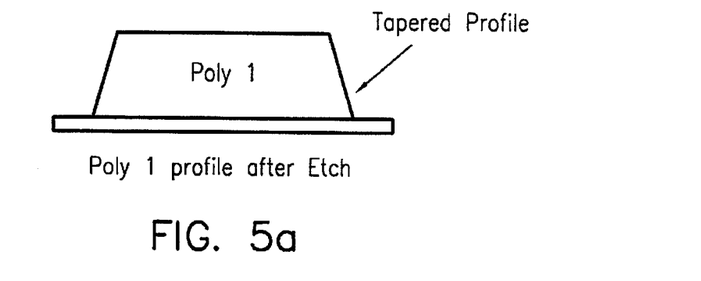
FIGS. 5a through 5d are partial cross-section drawings illustrating the prior art process that utilizes a tapered profile for the first polysilicon layer structure.
Figure 5B:
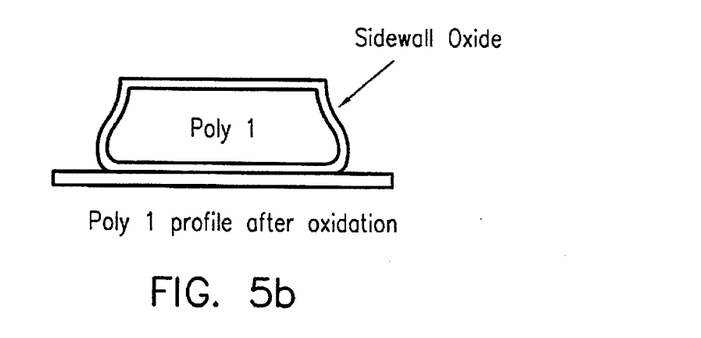
Figure 5C:
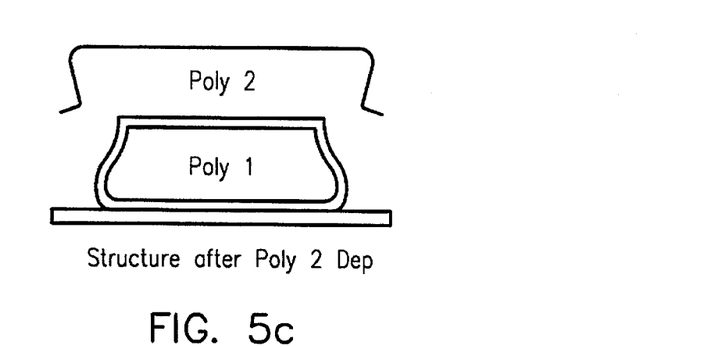
Figure 5D:
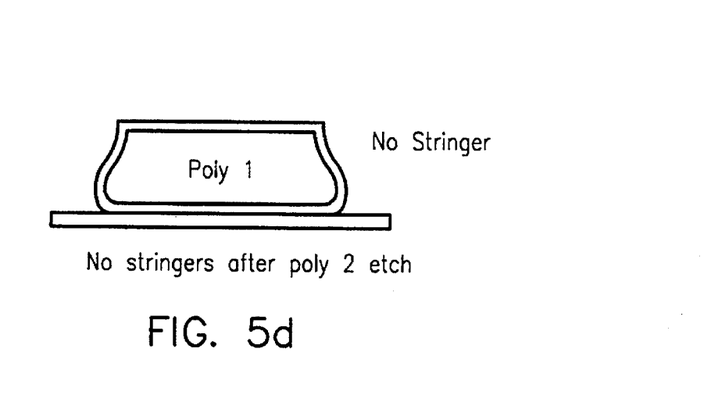

A second polysilicon layer 24 is subsequently deposited upon the inter-polysilicon oxide layer 20 and gate oxide 16 as shown in FIG. 2. After this second polysilicon layer is doped, it is masked and etched to define the top polysilicon electrode 28 of the capacitor, as shown in FIG. 3. Anisotropic etching is preferred for defining the second polysilicon layer 24 because it produces vertical profiles. However, the vertical nature of anisotropic etching leaves residual stringers 19 and 21 of the second polysilicon layer 24 in the overhang regions 13 and 15 of the first polysilicon structure, as shown in FIGS. 3 and 4b.

Yoichi, Japanese Pat. No. YJP 5183127, and Jasper, "Sloped Etching of Highly Phosphorous Doped Polysilicon" SPIE Vol. 1803 (1992), proposed the use of a tapered profile for the first polysilicon structure. As shown in FIGS. 5a–5d, a positively sloped, tapered structure eliminates the overhang region formed during gate oxidation, thereby preventing the production of a stringer during anisotropic etch of the second polysilicon layer.

Jasper used a $Cl_2O_2$—Ar mixture in a reactive ion etching process to obtain a tapered profile, but that process has proven to be difficult to control in manufacturing. Reactive ion etching is very sensitive to chemicals present in the etching equipment from different processing steps. For instance, if the same equipment is used to perform etching on both polysilicon and nitride, then the resulting etch can be effected if not all of the chemicals from a previous etching process have been purged from the equipment. In actual practice, it is quite difficult to purge the equipment of all chemicals between processing batches. Typically, a dedicated piece of equipment must be used for each type of material that is etched.

Yoichi used isotropic etching of the first polysilicon layer to obtain a positively sloped profile. Isotropic etching, however, tends to be difficult to control when trying to create the sloped profile and yield inconsistent results. Often, the isotropically produced profile is insufficient to prevent stringers from forming. In addition, tapered profile etching tends to produce linewidth variation the magnitude of which varies with pattern density (this is known as microloading effect).

SUMMARY OF THE INVENTION

The present invention provides a method for making a double polysilicon capacitor or FET that is compatible with submicron fabrication techniques for field effect transistor (FET) integrated circuit structures. The present invention employs a sidewall spacer on the first polysilicon structure to prevent the formation of an overhang on the first polysilicon structure during oxidation and to produce a tapered profile which eliminates creation of stringers.

In accordance with the invention, a first polysilicon layer is deposited on the wafer and then doped and etched to produce the first polysilicon structure that is the lower plate of a double polysilicon capacitor. Then a dielectric layer is deposited over the first polysilicon structure and anisotropically etched to produce a dielectric spacer on the sidewall of the first polysilicon structure. The first polysilicon structure is then oxidized to produce an interpolysilicon oxide on the first polysilicon structure. A second polysilicon layer is subsequently deposited over the interpolysilicon oxide. The second polysilicon layer is then anisotropically etched to obtain a vertical profile for the top polysilicon layer, but without the formation of polysilicon stringers.

The process may also be used to produce field effect transistors (FETs) utilizing the first polysilicon structure as the gate material for transistors. For transistors, the vertical geometry of the polysilicon gate material has better electrical characteristics than a tapered polysilicon gate.

BRIEF DESCRIPTION OF THE DRAWINGS

FIG. 13 is a reproduction of a photograph showing a cross section of the inventive structure as produced by the inventive process.

DETAILED DESCRIPTION OF THE INVENTION

Figure 6:
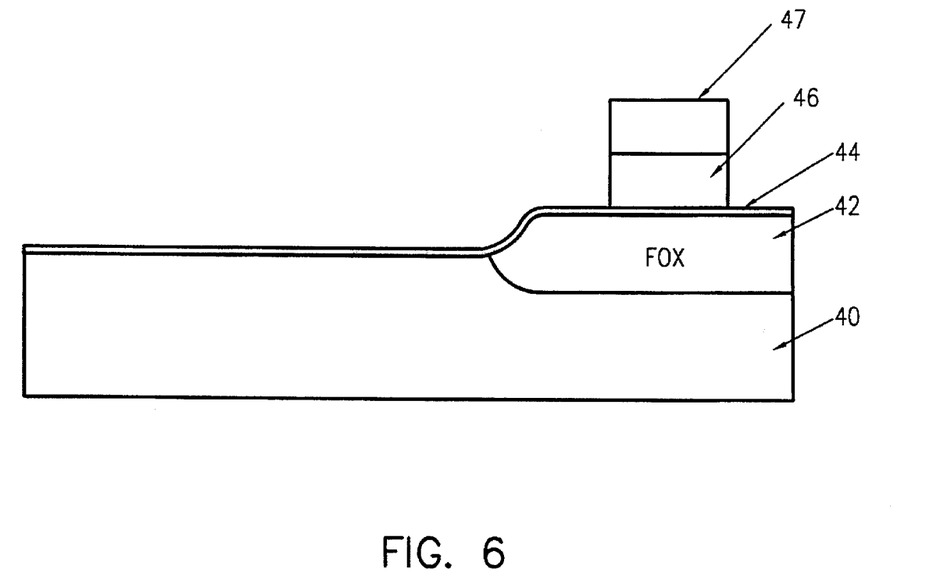
FIGS. 6 through 11 are partial cross-section drawings illustrating a progression of steps of a method in accordance with the present invention that utilizes a sidewall spacer to prevent stringer formation.

Referring to FIG. 6, in a method in accordance with the invention, a silicon substrate 40 is initially oxidized in a conventional manner to produce a field oxidation region 42 upon which a dual polysilicon capacitor will be formed. Alternatively, the silicon substrate 40 may be oxidized to produce a sacrificial oxide layer 44 in addition to or in place of field oxide 42. The sacrificial oxide step typically comprises a wet oxidation using oxygen, hydrogen and hydrochloric acid (HCL) at a temperature of about 900° C.

Next, a first polysilicon layer (typically using $SiH_4$) is deposited and doped to introduce charge carriers into the polysilicon material. Doping is typically accomplished by exposure to $POCl_3$ or by ion implantation with Phosphorous (P) or Arsenic (As). The first polysilicon layer is then anisotropically etched to produce polysilicon structure 46 which will act as the lower electrode of a dual polysilicon capacitor. The anisotropic etch produces a vertical sidewall profile in the resulting polysilicon structure 46 which has superior electrical characteristics as compared to a polysilicon structure with a tapered geometry when the polysilicon structure 46 is utilized to form a gate as well as a bottom electrode of a double polysilicon capacitor. The anisotropic etching step is typically performed using $C_2F_6$ in a dry etch.

At this point in the process, the transistor thresholds may be adjusted by ion implantation and the exposed portion of the sacrificial oxide 44 is removed. The photoresist mask 47 that was used to define and still covers the polysilicon structure must remain on the wafer during this processing to protect the polysilicon 46, but is removed afterwards. Threshold adjustment may be made at other points in the process such as before polysilicon is deposited.

Figure 7:
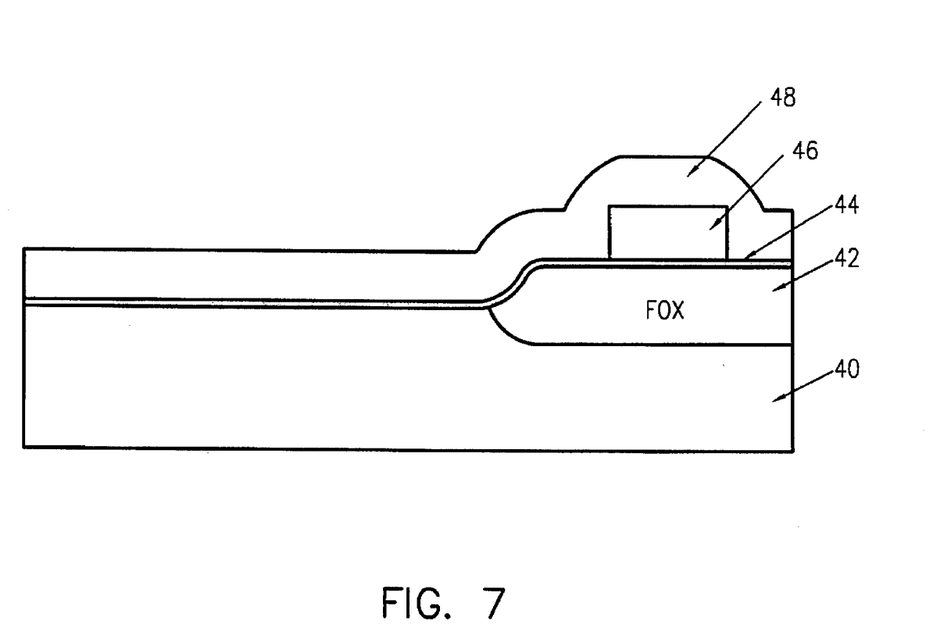

A dielectric layer 48 is then formed over all structures on substrate 40 including polysilicon structure 46, as shown in FIG. 7. The dielectric layer 48 is preferably produced using low temperature silicon oxide deposition such as plasma enhanced chemical vapor deposition (PECVD) or Thermal/Low Pressure Chemical Vapor Deposition (LPCVD) of Tetraethoxsysilane (TEOS) at a temperature in the range of about 300° to 700°C. Other silicon based oxide deposition methods include silane based LPCVD/PECVD. The thickness of the silicon dioxide comprising the dielectric layer 48 is between about 1500 to 5000Å and is preferably 2000Å.

Figure 8:
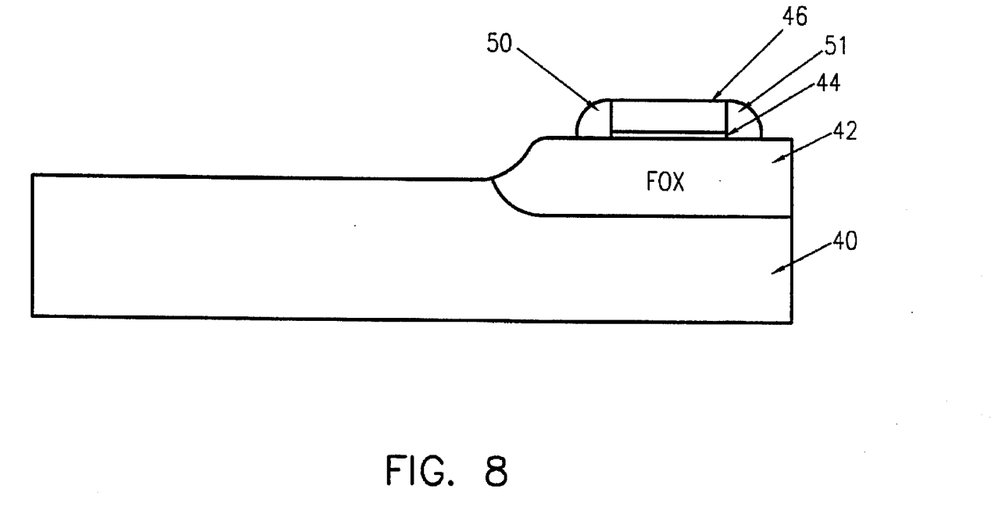

Dielectric layer 48 is then etched to produce sidewall spacers 50 and 51 on the sides of structure 46, as shown in FIG. 8. The sidewalls are produced using a two step process. First, an anisotropic etch comprising a timed, dry etch is used to remove approximately 1900Å of the layer. Since the etch is non-selective, it is halted before reaching the silicon substrate because the substrate will be damaged by the dry etch. A wet etch, that is less damaging to silicon, is then utilized to remove the remaining approximately 100Å of spacer material.

Figure 9:
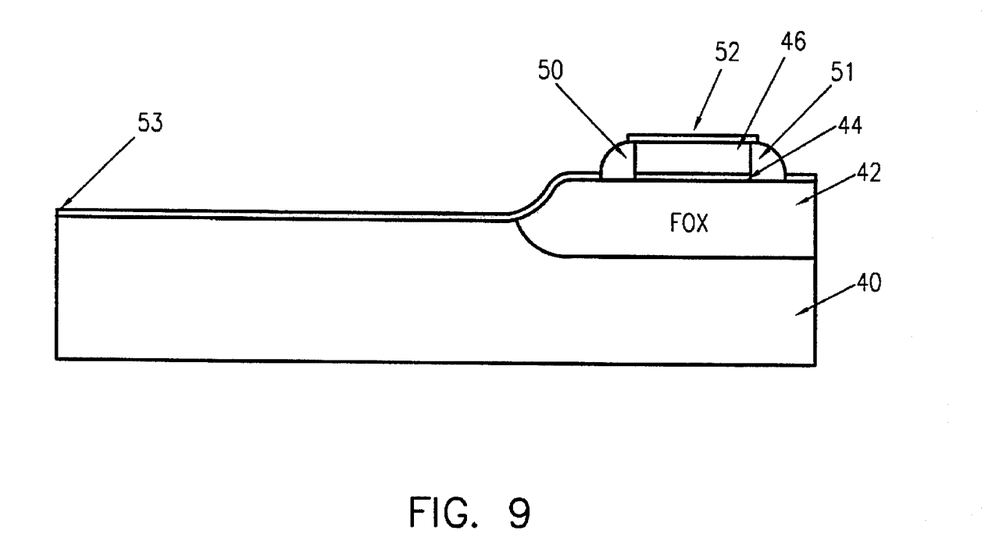
Figure 12A:
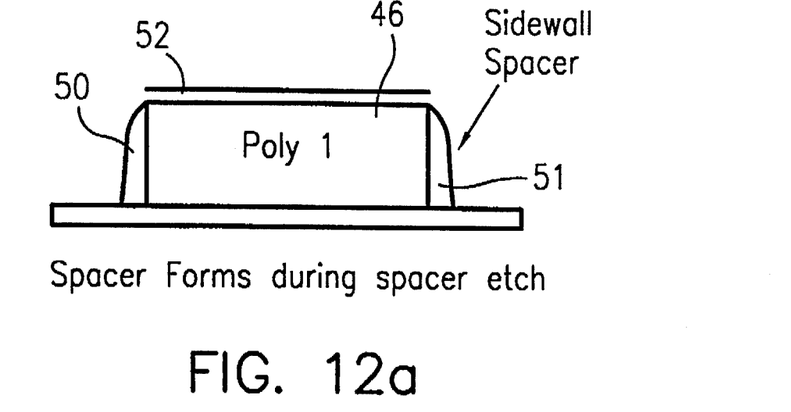
FIGS. 12a and 12a are partial cross-section drawings illustrating sidewall spacers formed during the inventive process.

At this point, a gate oxidation step is performed that forms a gate oxide 53 on the silicon for active devices and also forms a polysilicon oxide 52 on the polysilicon structure that will become the interpolysilicon dielectric layer of the capacitor, as shown in FIG. 9. An oxide-nitride-oxide (ONO) dielectric layer may also be formed on polysilicon structure 46 using a somewhat different, but conventional process. Because the polysilicon material is more reactive due to the presence of dopants, oxidation that produces the gate oxide 53 of about 150Å thickness produces a polysilicon oxide 52 of about 470Å. In the prior art, the gate oxidation step caused the polysilicon structures to become irregularly shaped and produced overhang regions 13 and 15, as shown in FIG. 4a, wherein residual polysilicon would form during subsequent processing. However, in the process of dielectric the invention, the presence of sidewalls 50 and 51 protects polysilicon structure 46, as shown in FIGS. 9 and 12a, and prevents the formation of overhang regions in the present invention thereby eliminating polysilicon stringer formation during later processing.

Figure 10:
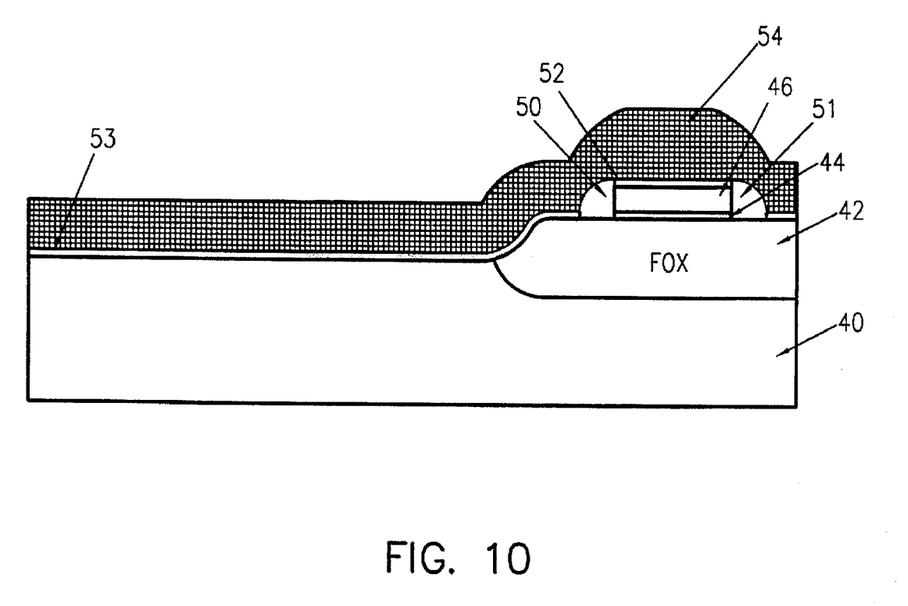
Figure 11:
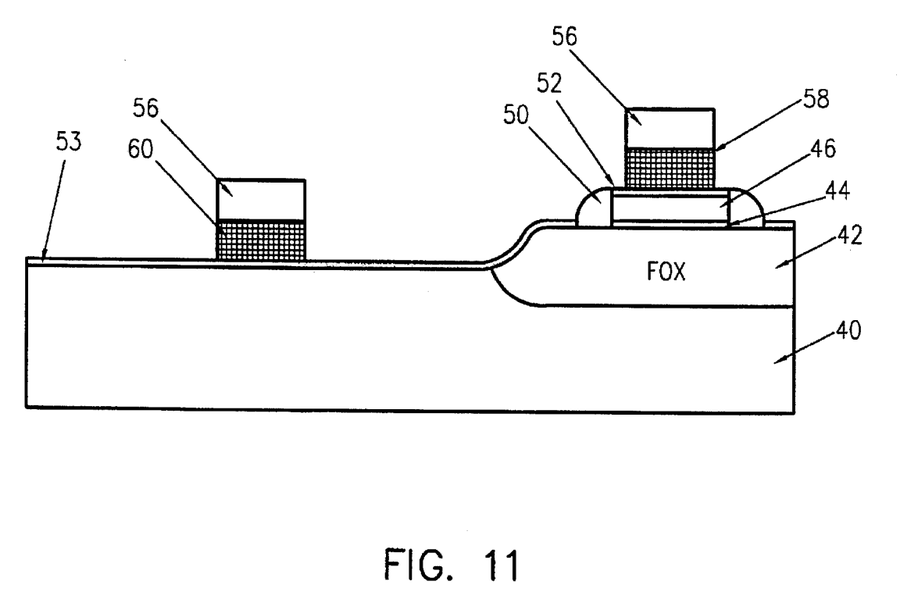
Figure 12B:
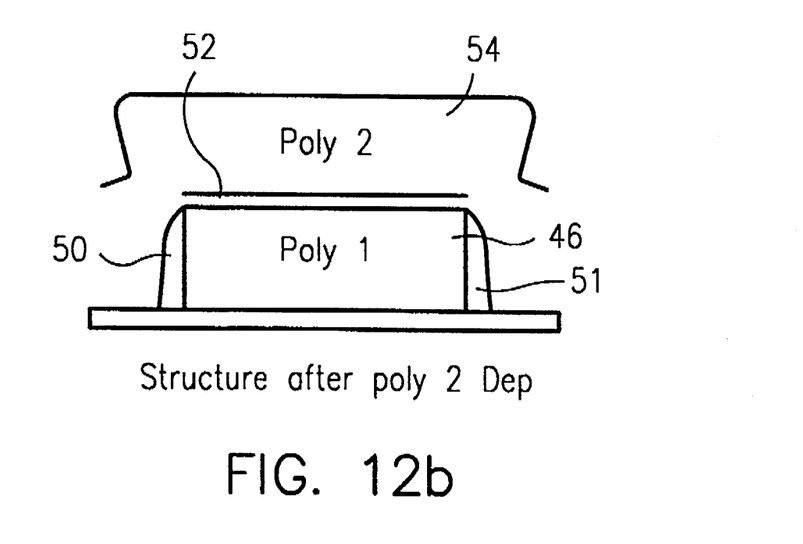

Subsequently, a second polysilicon layer 54 is deposited upon first polysilicon structure 46 in FIGS. 10 and 12b. After second polysilicon layer 54 is doped, masking and etching is performed to define a top polysilicon electrode 58 of the capacitor out of polysilicon layer 54, as shown in FIG. 11. Use of anisotropic etching for the processing of polysilicon layer 54 results in vertical sidewall profiles in the polysilicon layer 54 structures, but without the formation of residual polysilicon layer 54 stringers, as the photo in FIG. 13 illustrates.

The inventive process prevents formation of polysilicon stringers by the use of dielectric spacer sidewalls that prevent the formation of overhang regions during gate oxidation of the first polysilicon layer and create a tapered profile for the first polysilicon structure 46. Consequently, no stringers are produced when the second polysilicon layer is deposited and anisotropically etched because there are no overhang regions present in the first polysilicon structure. The etch processing is relatively simple to control as compared to prior art processes that produce tapered sidewalls.

In addition to producing the dual polysilicon capacitor discussed here, the process may be used to define conductive structures in the first polysilicon layer without the formation of stringers due to subsequent definition of a second polysilicon layer.

What is claimed is:

1. A process of forming a stacked polysilicon structure on an underlying material, the process comprising the steps of:

forming a first layer of polysilicon on the material;

anisotropically etching the first layer of polysilicon to form a first polysilicon region having substantially vertical sidewalls;

forming a dielectric spacer layer on the structure resulting from the foregoing steps;

etching the dielectric spacer layer in a two-step etch module to form dielectric sidewall spacers on the substantially vertical sidewalls of the first polysilicon region, the two-step etch module including an initial anisotropic dry etch that removes a substantial thickness of the dielectric spacer layer while leaving a remaining portion of the dielectric spacer layer and a wet etch that removes the remaining portion of the dielectric spacer layer, whereby an upper surface of the first polysilicon region is exposed;

forming a layer of interpolysilicon dielectric material on the exposed upper surface of the first polysilicon region;

forming a second layer of polysilicon on the structure resulting from the above-recited steps; and anisotropically etching the second layer of polysilicon to form a second polysilicon region over the first polysilicon region but separated therefrom by interpolysilicon dielectric material.

2. The process of claim 1 wherein the dielectric spacer layer is formed using plasma enhanced vapor deposition.

3. The process of claim 1 wherein the plasma enhanced vapor deposition is carried out at a temperature between about 300 degrees Celsius and 700 degrees Celsius.

4. The process of claim 1 wherein the dielectric spacer layer is formed using Thermal/LPCVD TEOS deposition.

5. The process of claim 4 wherein the Thermal/LPCVD TEOS deposition is carried out at a temperature between about 300 degrees Celsius and 700 degrees Celsius.

6. The process of claim 1 wherein the resulting thickness of the dielectric spacer layer is between about 1500 and 5000 Angstrom units.

7. The process of claim 1 wherein the resulting thickness of the dielectric spacer layer is about 2000 Angstrom units.

8. The process of claim 7 wherein the initial anisotropic dry etch removes approximately 1900Å of the dielectric spacer layer and the wet etch removes the remaining approximately 100Å of spacer material.

9. The process of claim 1 wherein the interpolysilicon dielectric material is silicon oxide.

10. The process of claim 1 wherein the interpolysilicon dielectric material is oxide/nitride/oxide (ONO).

* * * * *